(12) United States Patent
Guo

(10) Patent No.: US 11,043,631 B2
(45) Date of Patent: Jun. 22, 2021

(54) PERPENDICULAR MAGNETORESISTIVE ELEMENTS

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 0 days.

(21) Appl. No.: 16/824,657

(22) Filed: Mar. 19, 2020

(65) Prior Publication Data

US 2020/0220071 A1 Jul. 9, 2020

Related U.S. Application Data

(63) Continuation-in-part of application No. 14/063,204, filed on Oct. 25, 2013, now Pat. No. 10,672,977.

(51) Int. Cl.

| | |
|---|---|
| *H01L 43/10* | (2006.01) |
| *H01L 43/02* | (2006.01) |
| *H01L 43/12* | (2006.01) |
| *H01L 27/22* | (2006.01) |
| *H01F 41/32* | (2006.01) |
| *G11C 11/16* | (2006.01) |
| *H01F 10/32* | (2006.01) |

(52) U.S. Cl.
CPC ............ *H01L 43/10* (2013.01); *G11C 11/161* (2013.01); *G11C 11/1659* (2013.01); *G11C 11/1675* (2013.01); *H01F 10/3286* (2013.01); *H01F 41/32* (2013.01); *H01L 27/226* (2013.01); *H01L 43/02* (2013.01); *H01L 43/12* (2013.01)

(58) Field of Classification Search
CPC ......... H01L 43/02; H01L 43/08; H01L 43/10; H01L 43/12; G11C 11/14–16; G11C 11/161

See application file for complete search history.

(56) References Cited

U.S. PATENT DOCUMENTS

| | | | |
|---|---|---|---|
| 2008/0088980 A1* | 4/2008 | Kitagawa ............... | H01F 10/329 360/313 |
| 2012/0068284 A1* | 3/2012 | Kitagawa ................ | H01L 43/08 257/421 |
| 2012/0146167 A1* | 6/2012 | Huai ....................... | H01L 43/08 257/421 |

* cited by examiner

*Primary Examiner* — Allison Bernstein

(57) ABSTRACT

A perpendicular magnetoresistive element includes a novel buffer layer having rocksalt crystal structure interfacing to a CoFeB-based recording tri-layer has (100) plane parallel to the substrate plane and with {110} lattice parameter being slightly larger than the bcc CoFe lattice parameter along {100} direction, and crystallization process of amorphous CoFeB material in the recording layer during thermal annealing leads to form bcc CoFe grains having epitaxial growth with in-plane expansion and out-of-plane contraction. Accordingly, a perpendicular anisotropy, as well as a perpendicular magnetization, is induced in the recording layer. The invention preferably includes materials, configurations and processes of perpendicular magnetoresistive elements suitable for perpendicular spin-transfer torque MRAM applications.

7 Claims, 1 Drawing Sheet

PERPENDICULAR MAGNETORESISTIVE ELEMENTS

RELATED APPLICATIONS

This application is a continuation in part of the U.S. utility patent application Ser. No. 14/063,204 filed on Oct. 25, 2013, which is based upon and claims the benefit of priority from US provisional patent application No. 61/740,764, filed Dec. 21, 2012, and the entire contents of each of which are incorporated herein by reference.

BACKGROUND OF THE INVENTION

1. Field of the Invention

This invention relates to the field of perpendicular magnetoresistive elements. More specifically, the invention comprises perpendicular spin-transfer-torque magnetic-random-access memory (pSTT-MRAM) using a reversed layer-by-layer sequence of the perpendicular magnetoresistive elements disclosed in our U.S. patent application Ser. No. 14/063,204 as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three layer stack structure formed by stacking a recording layer having a changeable magnetization direction, an insulating spacing layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong magnetic crystalline anisotropy, shape anisotropies are not used, and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetic coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystal matching and material diffusion during the heat treatment in the device manufacturing process.

In a spin-injection MRAM using a perpendicular magnetization film, a write current is proportional to the damping constant and inversely proportional to a spin polarization, and increases in proportional to a square of an area size. Therefore, reduction of the damping constant, increase of the spin polarization, maintain of the perpendicular anisotropy and reduction of an area size are mandatory technologies to reduce the write current.

BRIEF SUMMARY OF THE PRESENT INVENTION

The present invention comprises a bottom-pinned perpendicular magnetoresistive element for perpendicular spin-transfer-torque MRAM. A magnetoresistive element typically consists of a free layer (or recording layer), a reference layer having a pinned magnetization and a tunneling barrier (or spacing layer) which is sandwiched between the free layer and the reference layer. A bottom pinned magnetoresistive element refers to the one having a reference layer at the bottom and underneath the tunneling barrier and the free layer. The perpendicular magnetoresistive element in the invention are sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

The invention includes a magnetoresistive element comprising (counting from the device bottom): a reference layer having magnetic anisotropy in a direction perpendicular to a film surface and having an invariable magnetization direction; a recording layer having magnetic anisotropy in a direction perpendicular to a film surface and having a variable magnetization direction; a spacing layer provided between said reference layer and said recording layer; and a buffer layer provided on a surface of the recording layer, which is opposite to a surface of the recording layer where the spacing layer is provided, wherein at least the portion of the buffer layer interfacing to the recording layer contains a rocksalt crystal structure having the (100) plane parallel to the substrate plane and with lattice parameter along its {110} direction being slightly larger than the bcc (body-centered cubic)-phase Co lattice parameter along {100} direction; and a cap (base) layer provided on a surface of the buffer layer, which is opposite to a surface of the buffer layer where the recording layer is provided.

As an amorphous ferromagnetic material, like CoFeB, in the recording layer is thermally annealed, a crystallization process occurs to form bcc CoFe grains having epitaxial growth with (100) plane parallel to surface of the rocksalt crystal buffer layers with in-plane expansion and out-of-plane contraction. Accordingly, a perpendicular anisotropy, as well as a perpendicular magnetization, is induced in the recording layer. The invention preferably includes materials, configurations and processes of perpendicular magnetoresistive elements.

DETAILED DESCRIPTION OF THE INVENTION

The invention comprises a perpendicular spin-transfer-torque magnetic-random-access memory (pSTT-MRAM) using a reversed layer-by-layer sequence of the perpendicular magnetoresistive elements (PME) as basic memory cells which potentially replace the conventional semiconductor memory used in electronic chips, especially mobile chips for power saving and non-volatility. In general, according to the following embodiments, said PME comprises:

a reference layer having magnetic anisotropy in a direction perpendicular to a film surface and having an invariable magnetization direction, wherein said reference layer contains a hard magnet/soft magnetic bi-layer or multi-layer superlattice structure;

a recording layer having magnetic anisotropy in a direction perpendicular to a film surface and having a variable magnetization direction, wherein said recording layer contains a tri-layer stack having two soft ferromagnetic layers separated by a non-magnetic metal layer;

a spacing layer provided between said reference layer and said recording layer, wherein said spacing layer is a MgO oxide;

a buffer layer provided on the surface of said recording layer, which is opposite to a surface of said recording layer where said spacing layer is provided, wherein at least the portion of said buffer layer interfacing to said recording layer contains a rocksalt crystal structure having the (100) plane parallel to the substrate plane and with lattice parameter along its {110} direction being larger than the bcc (body-centered cubic)-phase Co lattice parameter along {100} direction;

a magnetic compensating layer on the surface of said buffer layer and having magnetic anisotropy in a direction perpendicular to a film surface and having a second invariable magnetization direction;

and a cap (or base) layer provided on the surface of said buffer layer or compensating layer.

First Embodiment

Figure 1:
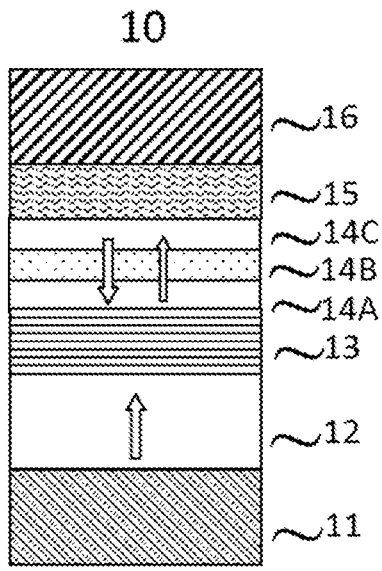
FIG. 1 is a cross-sectional view showing a bottom-pinned configuration of an MTJ element 10 according to the first embodiment.

FIG. 1 is a cross-sectional view showing a configuration of a reversed layer-by-layer sequence (bottom-pinned) MTJ element 10 as a MTJ element according to the first embodiment. The MTJ element 10 is configured by stacking a bottom electrode 11, a reference layer 12, a spacing layer (tunnel barrier layer) 13, a recording tri-layer (14A,14B, 14C), a buffer layer 15, and a cap layer (or top electrode) 16 in this order from the device bottom Said recording layer 14 made of soft-magnet (14A)/non-magnetic metal (14B)/soft-magnet (14C) tri-layer, and reference layer 12 both have uni-axial magnetic anisotropy in a direction perpendicular to a film surfaces. Further, directions of easy magnetization of said recording layer 14 and reference layer 12 are also perpendicular to the film surfaces. In another word, the MTJ element 10 is a perpendicular MTJ element in which magnetization directions of said recording layer 14 and reference layer 12 face in directions perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists.

Said recording layer 14 has a variable (reversible) magnetization direction and said reference layer 12 has an invariable (fixing) magnetization direction. Said reference layer 12 is made of a hard magnet/soft-magnet bi-layer having a perpendicular magnetic anisotropic energy which is sufficiently greater than said recording layer 14. This strong perpendicular magnetic anisotropy can be achieved by selecting a material, configuration and a film thickness. In this manner, a spin polarized current may only reverse the magnetization direction of said recording layer 14 while the magnetization direction of said reference layer 12 remains unchanged. An MTJ element 10 which comprises a recording layer 14 having a variable magnetization direction and a reference layer 12 having an invariable magnetization direction for a predetermined write current can be achieved.

Said spacing layer 13 is made of a non-magnetic material for which a non-magnetic insulating metal oxide or nitride can be used.

Said buffer layer 15 may serve to introduce or improve perpendicular magnetic anisotropy of said recording layer 14. A damping constant of the recording layer 14 sometimes increases (deteriorates) depending on a material in contact with the recording layer 14, which is known as a spin pumping effect. The buffer layer 15 may also have a function to prevent increase of the damping constant of the recording layer 14 by reducing the spin pumping. The buffer layer 15 is made of an oxide (or nitride, chloride) layer which has a rocksalt crystalline as its naturally stable structure thereof will be described later.

An example configuration of the MTJ element 10 comprises a reference layer 12 made of TbCoFe(5-15 nm)/CoFeB (0.8-2 nm) or (Pd/Co)$_n$/CoFeB with n between 1-5, a spacing layer 13 made of MgO (1 nm), a recording (14A/14B/14C) tri-layer made of (CoFeB or CoB)(0.8-1.5 nm)/(W or Mo)(0.15-0.5 nm)/(CoFeB or CoB)(0.5-1 nm), a buffer layer 15 made of MgZnO or MgZnO (0.8-1.5 nm) and a cap layer 16 made of Ta (20 nm)/Cu (20 nm)/Ta (20 nm). Each element written in the left side of "/" is stacked below an element written in the right side thereof.

Since a high resistance layer can be formed when the MgZnO buffer layer is used, a read output is caused to decrease when a read current flows across MgZnO buffer layer. A resistance of the MgZnO buffer layer can be reduced and decrease of the read output can accordingly be reduced by adopting a surface oxidization process, i.e. by using of a mixed gas containing natural oxygen ($O_2$), or radical, or ionized oxygen and Argon (Ar) after co-sputtering Mg and Zn metal layer. Such MgZnO composition contains less oxygen in the portion of the buffer layer facing to the base layer than the composition by sputtering of MgZnO or co-sputtering of Mg and Zn in a mixed gas containing oxygen ($O_2$) and Argon (Ar).

The CoFeB (with B content no less than 20%) layer comprised in said recording layer 14 is formed into an amorphous state as deposited. The MgZnO layer comprised in said buffer layer 15 is formed into rocksalt crystal grains with the (100) plane parallel to the substrate plane. In the rocksalt crystal structure, two fcc (face-center-cubic) sub-lattices for metal atom (Mg or Zn) and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal buffer layers with in-plane expansion and out-of-plane contraction. Accordingly, a perpendicular magnetization is induced in the recording layer.

Second Embodiment

Figure 2:
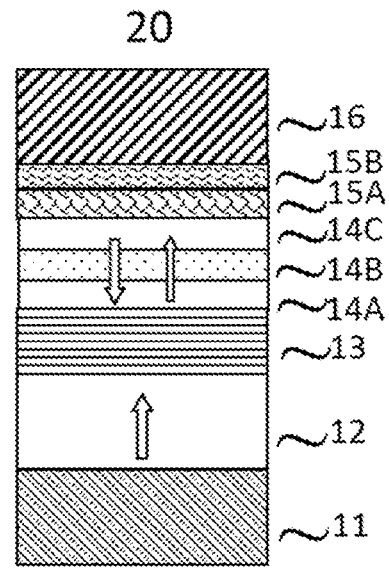
FIG. 2 is a cross-sectional view showing a bottom-pinned configuration of an MTJ element 20 according to the second embodiment.

FIG. 2 is a cross-sectional view showing a configuration of a reversed layer-by-layer sequence (bottom-pinned) of the MTJ element 20 according to the second embodiment. The MTJ element 20 is configured by stacking a bottom electrode 11, a reference layer 12, a spacing layer (tunnel barrier layer) 13, a recording tri-layer (14A,14B,14C), a bi-layer (15A, 15B) buffer layer, and a cap layer (or top electrode) 16 in this order from the device bottom.

While the other layers in FIG. 2 are all the same as described in first embodiment (FIG. 1), said buffer layer 15 contains a bi-layer structure MgO (15A)/ZnO(15B) with MgO (15A) in contact with the top surface of said recording layer. Naturally, MgO can easily form stable rocksalt crystal grains, while ZnO(15B) typically forms hexagonal crystal structure, instead of rocksalt crystal. Once an MgO seed layer having a rocksalt crystal with a cubic lattice plane (100) as a substrate, ZnO rocksalt crystal grains can readily epitaxially grow on top of MgO layer. The lattice mismatch between ZnO along {110} direction and bcc CoFe along {100} direction is slightly higher than that between MgO and bcc CoFe, a stronger perpendicular anisotropy is expected in the recording layer. Accordingly, the thermal energy stability of the perpendicular MRAM improves.

An example configuration of the MTJ element 20 comprises a reference layer 12 made of a bi-layer TbCoFe(5-15 nm)/CoFeB (0.8-2 nm) or a multi-layer (Pd/Co)$_n$/CoFeB with n between 1-5, a spacing layer 13 made of MgO (1 nm)/recording (14A/14B/14C) tri-layer made of CoFeB of CoB (0.8-1.5 nm)/(W or Mo (0.15-0.5 nm))/CoFeB or CoBe (0.5-1 nm), a buffer layer 15 made of MgO or MgZnO (0.8-2 nm) and a cap layer 16 made of Ta (20 nm)/Cu (20 nm)/Ta (20 nm). Each element written in the left side of "/" is stacked below an element written in the right side thereof.

Said CoFeB or CoB in (CoFeB of CoB)/(W or Mo)/(CoFeB or CoB) tri-layer (with B content no less than 20%) in said recording layer 14 is formed into an amorphous state as deposited. After thermal annealing with a temperature higher than 250-degree, the amorphous CoFeB is crystallized to form bcc CoFe grains having epitaxial growth with (100) plane parallel to surface of the rocksalt crystal buffer layers with in-plane expansion and out-of-plane contraction. Accordingly, a perpendicular magnetization is induced in the recording layer.

Third Embodiment

Figure 3:
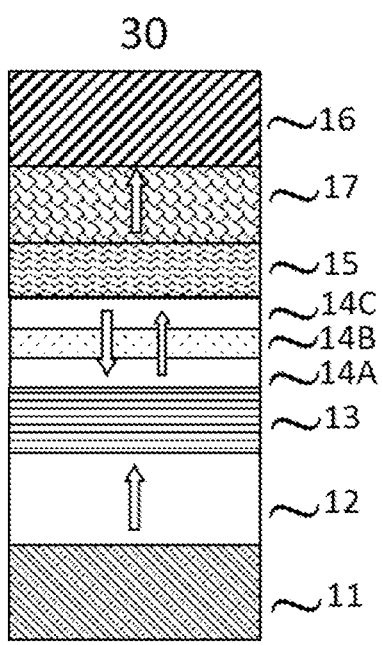
FIG. 3 is a cross-sectional view showing a bottom-pinned configuration of an MTJ element with a compensating layer 30 according to the third embodiment.

FIG. 3 is a cross-sectional view showing a bottom-pinned configuration of an MTJ element with a compensating layer 30 according to the third embodiment. The MTJ element 30 is configured by stacking a bottom electrode 11, a reference layer 12, a spacing layer (tunnel barrier layer) 13, a recording (14A,14B,14C) tri-layer, a buffer layer 15, a magnetic compensating layer 17, and a cap layer (or top electrode) 16 in this order from the device bottom.

Figure 4:
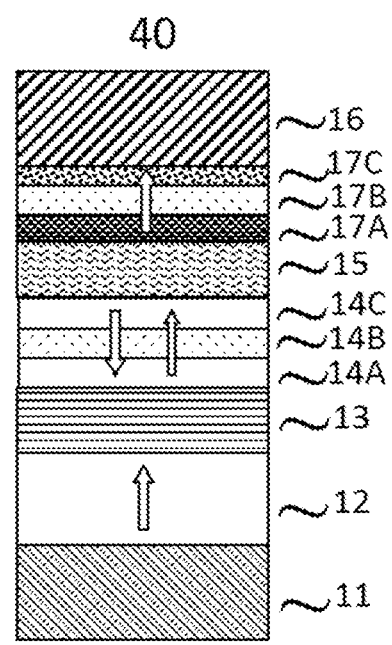
FIG. 4 is a cross-sectional view showing a bottom-pinned configuration of an MTJ element with a compensating layer 40 according to the third embodiment.

While the other layers in FIG. 3 are all the same as described in first embodiment (FIG. 1), a magnetic compensating layer 17 is inserted between said buffer layer 15 and cap layer 16. Said compensating layer 17 has a magnetic anisotropy in a direction perpendicular to a film surface and an invariable magnetization direction that is anti-parallel to the invariable magnetization direction of the reference layer. Said compensating layer 17 has a matched or near (+/−1.2 times) matched net magnetic moment as that of the reference layer and a varying magnetic field is applied to set the second invariable magnetization direction of the compensating layer anti-parallel or parallel to the first invariable magnetization direction of said reference layer. Said compensating layer comprises either a single layer (17 in FIG. 3) or a multilayer (17A,17B,17C as shown in stack 40 of FIG. 4) with at least one layer or sub-layer having one or more of material(s) of CoB, CoFeB, and FeB immediately adjacent to said buffer layer. Without shown in a drawing, said compensating layer may also comprises a bi-layer structure TbCoFe/CoFeB or CoFeB/TbCoFe.

An example configuration of the MTJ element 30 comprises a reference layer 12 made of a multi-layer (Pd/Co)n/CoFeB (1-2 nm), a spacing layer 13 made of MgO (1 nm), a recording (14A/14B/14C) tri-layer made of CoFeB or CoB (0.8-1.5 nm)/(W or Mo (0.15-0.5 nm))/CoFeB or CoBe (0.5-1 nm), a buffer layer 15 made of MgO or MgZnO (0.8-2 nm), a compensating layer 17 made of (CoB, CoFeB, FeB)(1-2 nm) and a cap layer 16 made of Ta (20 nm)/Cu (20 nm)/Ta (20 nm). Another example configuration as shown in the MTJ element 40 is similar to the MTJ element 30, except that the single compensating layer 17 is replaced by a tri-layer structure (CoB, CoFeB, FeB)/TbCoFe(5-15 nm)/(CoB, CoFeB, FeB). Here, (Pd/Co)n is a superlattice structure which enables a strong perpendicular magnetic anisotropy of the reference layer. Each element written in the left side of "/" is stacked below an element written in the right side thereof.

While certain embodiments have been described above, these embodiments have been presented by way of example only, and are not intended to limit the scope of the inventions. In principle, all the top-pinned perpendicular MTJ elements disclosed in U.S. utility patent application Ser. No. 14/063,204 can be reversed with valid layer-by-layer sequence. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A perpendicular magnetoresistive elements (PME) comprising:
    a reference layer having a magnetic anisotropy in a direction perpendicular to a film surface and having an invariable magnetization direction;
    a tunnel barrier layer provided on a surface of said reference layer;
    a recording layer provided on a surface of said tunnel barrier layer, which is opposite to the surface of said reference layer, having a magnetic anisotropy in a direction perpendicular to a film surface and having a variable magnetization direction, wherein the recording layer contains a body-centered cubic (bcc) crystal structure having the (100) plane parallel to the substrate plane and is a multi-layer comprising a first Co-alloy layer immediately adjacent to said tunnel barrier layer including at least one of CoFeB, CoFeB/CoFe and CoFe/CoFeB, a second Co-alloy layer including at least one of CoFeB and CoB, an insertion layer provided between the first Co-alloy layer and the second Co-alloy layer and containing at least one element selected from Zr, Nb, W, Mo, Ru having a thickness less than 0.5 nm;
    a buffer layer provided on a surface of said recording layer, which is opposite to the surface of said tunnel barrier layer, wherein at least a portion of said buffer layer interfacing with the recording layer comprises a rocksalt crystal structure having a (100) plane parallel to a substrate plane and having a first lattice parameter along a {110} direction of the rocksalt crystal structure of the buffer layer being larger than a second lattice parameter along a {100} direction of the bcc crystal of the recording layer by a first difference;
    a magnetic compensating layer provided on a surface of said buffer layer, which is opposite to the surface of said recording layer, and having magnetic anisotropy in a direction perpendicular to a film surface and having a second invariable magnetization direction; and
    a cap layer provided on a surface of said magnetic compensating layer, which is opposite to the surface of said buffer layer.

2. The element of claim 1, wherein said compensating layer is a multilayer having a sub-layer comprising CoFe or CoFeB, FeB immediately adjacent to said buffer layer.

3. The element of claim 1, wherein the perpendicular magnetic anisotropy value of said compensating layer is at least 1.2 times as large as or at least 1.2 times as small as the perpendicular magnetic anisotropy of said reference layer.

4. The element of claim 1, wherein said compensating layer has a matched or near-matched net magnetic moment as said reference layer.

5. The element of claim 1, wherein said magnetic compensating layer comprises a perpendicular hard magnet/soft-magnet bi-layer selected from (TbCoFe or TbCo)/CoFeB, or multi-layer selected from (TbCoFe/CoFeB)$_n$ with n between 2-5.

6. The element of claim 1, wherein said buffer layer comprises a single layer of oxide, or nitride, or chloride having a rocksalt crystal structure with at least one element selected from Na, Li, Ca, Zn, Cd, In, Sn, Cu, Ag, Ni, and Si, or a metal oxide layer having naturally stable rocksalt crystal structure selected from MgO, CaO, ZnO, MgZnO, MgCdO, and CdZnO having less oxygen in the portion of said buffer layer interfacing to said magnetic compensating layer.

7. A method of sequentially forming a magnetoresistance effect element comprising the steps of: forming a reference layer having a magnetic anisotropy in a direction perpendicular to a film surface and having an invariable magnetization direction; forming an MgO tunnel barrier layer on the reference layer; forming a recording tri-layer having a sandwich structure of magnetic layer/non-magnetic layer/magnetic layer and having a magnetic anisotropy in a direction perpendicular to a film surface and having a variable magnetization direction on the MgO tunnel barrier layer; forming an MgO buffer layer on the recording tri-layer; and forming a cap layer on the MgO buffer layer, wherein the recording tri-layer is formed by a three-step sequential deposition process comprising: depositing a first Co-alloy layer including at least one of CoFeB, CoFeB/CoFe and CoFe/CoFeB on the MgO tunnel barrier layer; depositing an insertion layer including at least one element selected from Zr, Nb, W, Mo, Ru and having a thickness less than 0.5 nm on the first Co-alloy layer; depositing a second Co-alloy layer including at least one of CoFeB and CoB on the insertion layer.

* * * * *